United States Patent
Kaginele

(10) Patent No.: US 7,421,630 B2
(45) Date of Patent: *Sep. 2, 2008

(54) APPARATUS AND METHODS FOR TESTING MEMORY DEVICES

(75) Inventor: Sathya P. Kaginele, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/474,495

(22) Filed: Jun. 26, 2006

(65) Prior Publication Data

US 2007/0168778 A1      Jul. 19, 2007

Related U.S. Application Data

(63) Continuation of application No. 10/648,311, filed on Aug. 27, 2003.

(51) Int. Cl.
*G11C 29/00* (2006.01)
*G11C 7/00* (2006.01)

(52) U.S. Cl. .................. 714/718; 365/200; 365/201

(58) Field of Classification Search ............... None
See application file for complete search history.

(56) References Cited

U.S. PATENT DOCUMENTS

| | | | |
|---|---|---|---|
| 5,034,923 A * | 7/1991 | Kuo et al. | 365/189.01 |
| 5,107,501 A | 4/1992 | Zorian | |
| 5,400,281 A * | 3/1995 | Morigami | 365/201 |
| 6,275,426 B1 | 8/2001 | Srinivasan et al. | |
| 7,002,823 B1 | 2/2006 | Ichiriu | |

* cited by examiner

*Primary Examiner*—Christine T Tu
(74) *Attorney, Agent, or Firm*—Dickstein Shapiro LLP

(57) ABSTRACT

Each match line of a memory device such as a content addressable memory (CAM) device and a related part of a priority encoder can be separately tested. In test mode, all match lines are first reset/disabled. A write enable pulse signal enables a match line corresponding to a CAM word line at a decoded address to be gated to the priority encoder of the CAM device. The CAM memory storage location and the comparand register are each loaded with the same test entry. A search is performed for the test entry. If the enabled match line is asserted and the priority encoder outputs the address corresponding to the CAM memory storage location, the test is successful. If not there is a match line error or a defect in the priority encoder.

12 Claims, 10 Drawing Sheets

APPARATUS AND METHODS FOR TESTING MEMORY DEVICES

This application is a continuation of application Ser. No. 10/648,311, filed on Aug. 27, 2003, which is hereby incorporated by reference in its entirety.

FIELD OF THE INVENTION

The present invention relates generally to memory devices and in particular to testing memory devices, in particular, content addressable memory (CAM) devices, and priority encoders for CAMs.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing data or tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically large and can be 96 bits or more.

In order to perform a memory search in the above-identified manner, CAMs are organized differently than other memory devices (e.g., DRAM and SRAM). For example, an item of data is stored in a RAM in a particular location, called an address. In conventional memory devices, during a memory access, the user supplies an address and reads into (writes) or retrieves the data at the specified address. In a typical CAM, however, items of data, often referred to as "entries", are stored in memory storage locations in a somewhat random fashion. The memory storage locations can be selected by an address bus, or an entry can be written into the first empty memory storage location. Every memory storage location has a pair of status bits that keep track of whether the memory storage location is storing valid information or is empty and available for writing.

Once an entry is stored in a CAM memory storage location, it is typically found by comparing it with data in a comparand register. When the contents stored in the CAM memory storage location do not match the data in the comparand register, the local match detection circuit returns a "no match" indication. When the contents stored in the CAM memory storage location match the data in the comparand register, the local match detection circuit returns a "match" indication.

The match and no match indications are typically provided to a priority encoder (PE) that is also part of the CAM device. If one or more local match detection circuits return a match indication, the PE also provides a "match" indication as an output. Otherwise, the PE returns a "no-match" indication. In addition, the PE identifies a memory storage location that provided a match indication and has priority, such as a highest or lowest priority, which is necessary because more than one CAM memory storage location may provide a match indication. A PE priority signal identifying a memory storage location is typically encoded as an address. Thus, with a CAM, the user supplies search data and receives an address if a match is found in memory.

Many current applications utilize ternary CAM cells, which are capable of storing three logic states. For example, the three logic states are logic "0", logic "1", and "don't care". Therefore, such CAM cells require two memory cells to store the logic states, as well as a comparison circuit for comparing stored bits with search data provided to the CAM.

FIG. 1 depicts a six transistor (6T) dynamic ternary CAM memory cell 100 of the prior art. Memory cell 100 has an "x" bit and a "y" bit. For the x bit, data is written to and read out of storage capacitor Cx 140 via bit line BLx 110 and access transistor 160. For the y bit, data is written to and read out of storage capacitor Cy 142 via bit line BLy 112 and access transistor 162. The access transistors 160, 162 are controlled by a common word line 132. It should be understood that the storage capacitors can be discrete components or the parasitic capacitance of the line 132. Alternately, other storage or memory devices may be used to store data in the memory cell 100. Although not shown, other memory cells 100 in a column of a memory array are coupled either to bit line BLx 110 and bit line BLy 112 or to their complements, bit line BLx* 114 and bit line BLy* 116. Although CAM memory cell 100 is shown as a dynamic ternary CAM memory cell, the CAM memory cell may also be implemented using other types of memory storage, e.g., the CAM memory cell may use SRAM memory cells.

To store a logic "0" in memory cell 100, a "1" must be written into the x bit, and a "0" must be written into the y bit of memory cell 100. To store a logic "1" in memory cell 100, a "0" must be written into the x bit and a "1" must be written into the y bit of memory cell 100. If a "0" is stored in both the x and the y bits of memory cell 100, then memory cell 100 will be masked for a search operation because it is a "don't care". If a "1" is stored in both the x and the y bits of memory cell 100, then memory cell 100 will always indicate a mismatch for search operations.

During a search operation, a search key/word is applied to search data lines SDx 120, SDy 122, which are coupled to the gate terminals of compare transistors 174, 176, respectively. Compare transistors 174, 176 are connected between common match line 130 and transistors 170, 172, respectively. Each transistor pair 174, 170 and 176, 172 is referred to as a compare "stack." The applied search key is compared to data stored in memory cell 100 to see if there is a match. To search for a "0," SDx is set to 0 and SDy is set to 1; to search for a "1," SDx is set to 1, and SDy is set to 0. The other transistor in each compare stack is controlled by the value stored by the respective capacitors Cx 140 and Cy 142.

If both transistors of either compare stack are turned on (high in the case of NMOS transistors) then the match line 130 is pulled down indicating a mismatch. If at least one transistor on each compare stack is off (low in the case of NMOS transistors) in cell 100 and all other cells connected to match line 130, then the match line 130 remains high indicating a match.

FIG. 2 shows a CAM array 200 and associated circuits 250, 252, 254, 256. The array 200 includes CAM memory cells 100 in rows and columns. Each row of CAM memory cells 100 stores an entry and is coupled to a respective word line 132 and match line 130, where every CAM memory cell 100 in the same row is mutually coupled to the word line 132 and match line 130. Each column of CAM memory cells 100 is coupled to respective search data lines SDx 120, SDy 122, and to bit lines BLx 110, BLy 112, BLx* 114, BLy* 116, where every CAM memory cell 100 in the same column is mutually coupled to the column's search data line SDx 120, SDy 122 and to either the column's bit line BLx 110 and bit line BLy 112 or the column's bit line BLx* 114 and bit line BLy* 116.

Every word line 132 is coupled to access/decode circuit 254 and to a respective word line driver 284. Every match line 130 is coupled to access/decode circuit 256 and to a respective sense amplifier 286. Every search data line SDx 120, SDy 122 is coupled to access/decode circuit 252 and to a respective search data driver 282. Every bit line BLx 110, BLy 112, BLx* 114, BLy* 116 is coupled to access/decode circuit 250, both for driving and sensing.

Testing of memory devices is extremely time consuming and costly. Testing, however, is necessary to identify errors; but conventional testing techniques, such as comparing an output address with an expected address, do not detect all defects in a CAM. If errors are not identified and repaired, stored data could become corrupted. In particular, CAM entries are often used to access addresses in networks, and data transmitted on a network may be misdirected with results ranging from nondelivery to misdelivery.

It would therefore be advantageous to have improved techniques for testing memory devices, particularly CAMs.

BRIEF SUMMARY OF THE INVENTION

The present invention provides apparatus and methods for testing memory devices. For example, each match line of a CAM can be tested.

In an exemplary embodiment an extra enable/disable line is added for each memory storage location's match line. In test mode, all match lines are first reset/disabled. In response to a write enable pulse, a CAM word line at a decoded address is pulsed, enabling the respective match line. The word line's storage location is also loaded with a test entry and the comparand register is loaded with the same test entry. A search is performed for the test entry with only the match line under test enabled. If the match line goes high and the priority encoder outputs its address, the match line and priority encoder pass the test. If not, there is a match line or priority encoder error.

These and other features and advantages of the invention will be apparent from the following detailed description and drawings.

DETAILED DESCRIPTION OF THE INVENTION

The invention provides techniques for testing memory devices in which a signal is provided if a set of memory cells store items of data that satisfy a criterion. In a CAM, for example, each memory storage location includes a set of memory cells, all of which can be connected to a match line. A match signal is provided on the match line if an entry or item of data stored in the memory storage location satisfies a matching criterion. The match signals are typically provided to a priority encoder (PE) and priority signals from the PE are used to provide output signals indicating search results.

Each "match signal" from a CAM array indicates whether one or more locations satisfy a match criterion applied in searching the CAM array. As used herein, the term "match signal" can refer to a signal indicating search results, however obtained, whether by comparing one memory storage location's data entry with a search index, by logically combining a number of such comparison results to obtain a combined match signal, or by any other appropriate comparison technique. A search index can, for example, be held in a comparand register, and the match criterion can require a match on some or all bits. As used herein, a match signal is "asserted" when it has a value indicating that one or more locations satisfy a matching criterion; although a bit is sometimes referred to as "on" to indicate that it is asserted, a match signal bit in a given circuit may be asserted when it has either of its values, whether high or low, on or off, "0" or "1", and not asserted when it has the other value.

The testing techniques of the invention can be used to identify defects that would otherwise be masked. For example, if a match line is electrically stuck to provide a match signal, it will mask defects in match lines over which it has priority and also defects in CAM memory storage locations served by those match lines. Specifically, if a higher priority match line is stuck high, defects in lower priority CAM memory storage locations will be masked. Similarly, a PE defect can mask defects.

In general, the novel testing techniques described herein make it possible to separately test each set of memory cells, and the test of each set of memory cells can also test its respective output circuitry. For example, by testing the match lines of a CAM, a priority encoder of a CAM is also tested. In other words, each CAM memory storage location, including its memory cells, its match line and its PE circuitry, can be tested separately from other memory storage locations. This avoids masking of defects.

Figure 1:
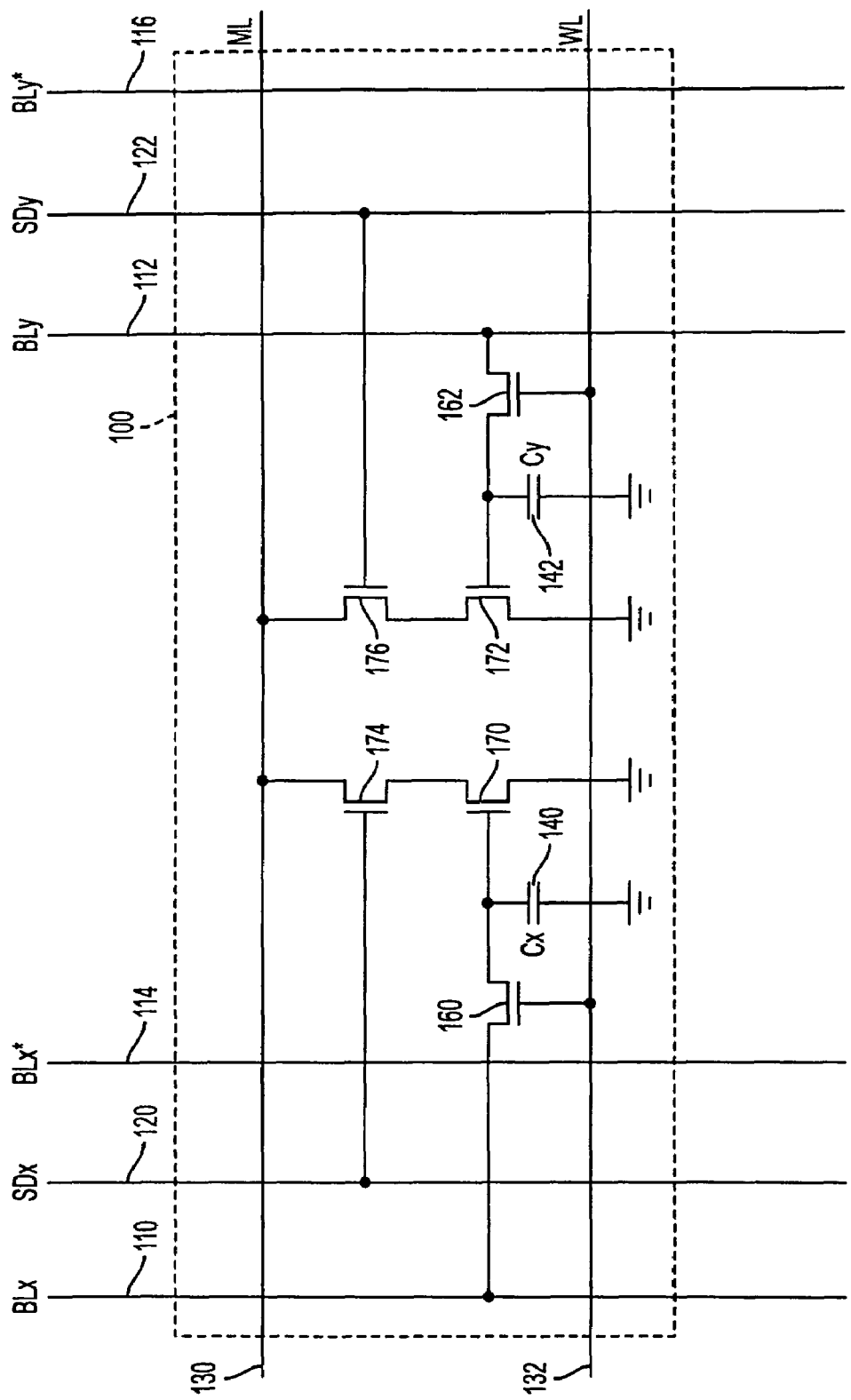
FIG. 1 is a schematic circuit diagram of a conventional six transistor (6T) dynamic ternary CAM memory cell.
Figure 2:
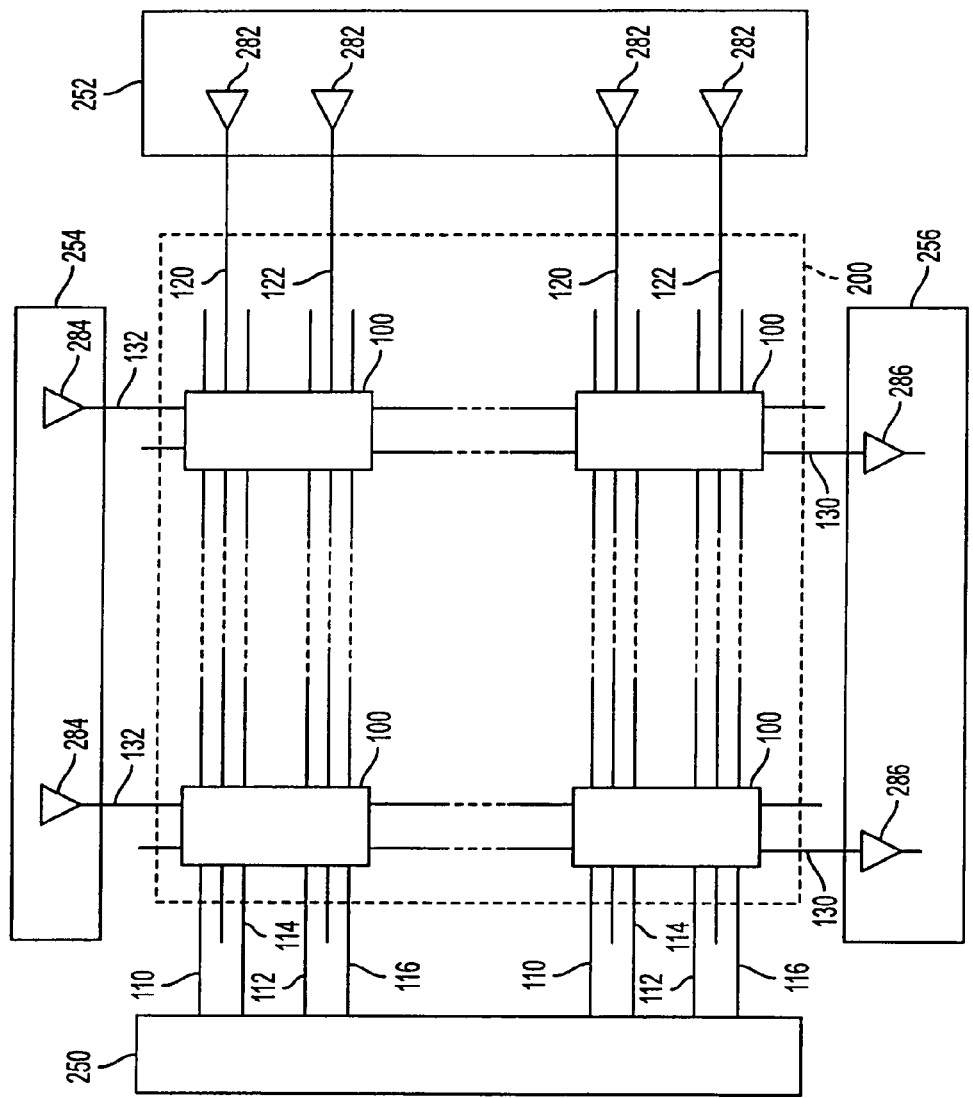
FIG. 2 is a schematic circuit diagram of conventional CAM array with memory cells as in FIG. 1.
Figure 3:
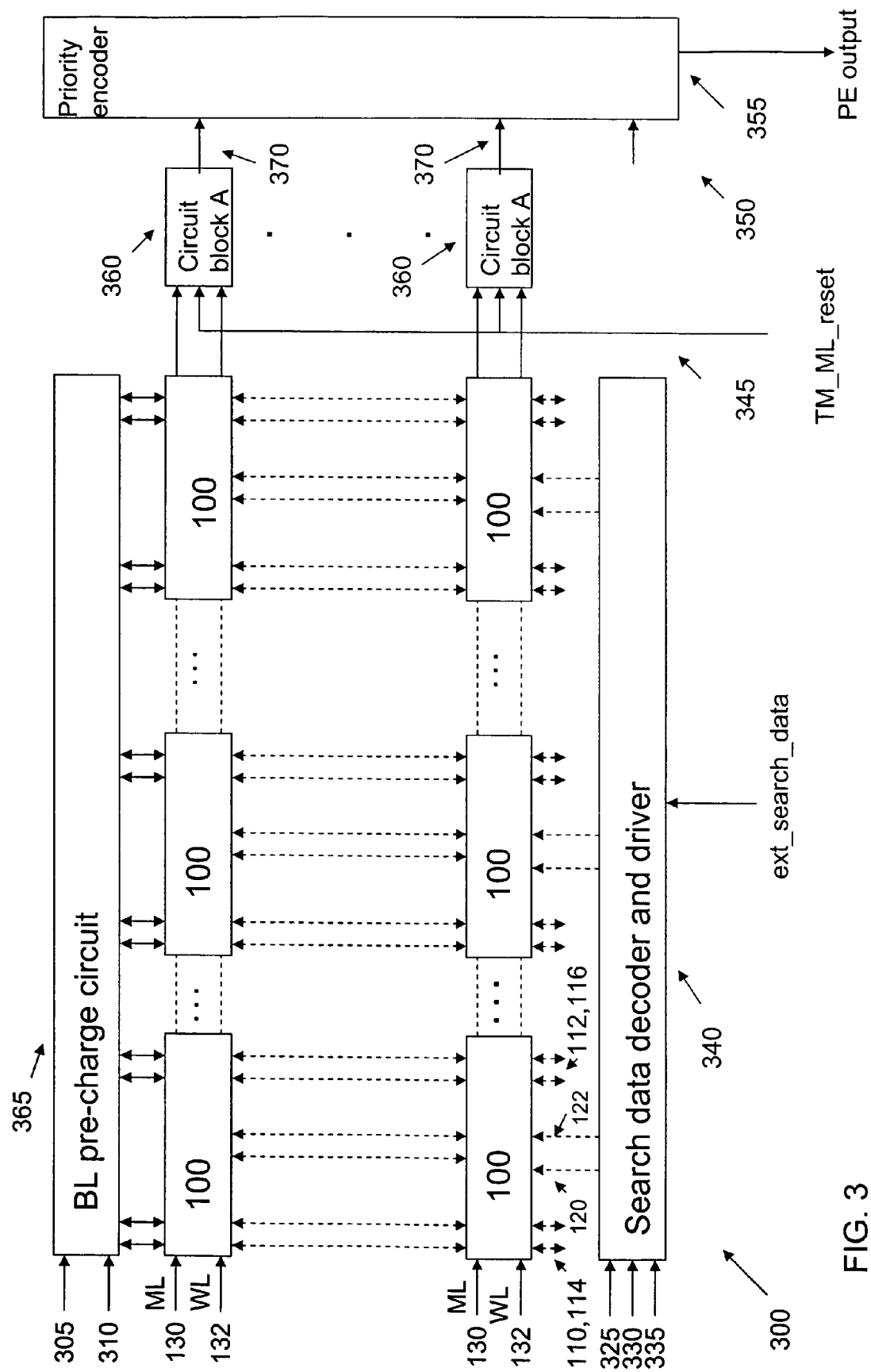
FIG. 3 is a schematic block diagram of a CAM device according to an exemplary embodiment of the invention.

FIG. 3 is a block diagram of a CAM device 300 according to an exemplary embodiment of the present invention. CAM device 300 includes circuitry for testing the match lines. CAM device 300 includes rows and columns of memory cells 100. Each row is a memory storage location in which an entry or item of data can be stored. Each memory cell 100 has associated search lines $SD_x$ 120 and $SD_y$ 122 and associated bit lines BLx 110, BLy 114, BLx* 112 BLy* 116 as in conventional CAM memory cell 100 in FIG. 1. Bit lines BLx 110, BLy 114, BLx* 112, BLy* 116 and search lines SDx 120 and SDy 122 are common to each column for all CAM memory cells. Match line ML 130 and word line WL 132 are common to each row of CAM memory cells.

CAM device 300, therefore, has a plurality (m) of CAM word lines 132 labeled WL, and corresponding CAM match lines labeled ML, where the CAM word lines and CAM match lines between CAM memory cells are indicated by a plurality of dots.

BL pre-charge circuit 365 receives a read enable (read_en) signal 305 and a write enable (write_en) signal 310. BL pre-charge circuit 365 further is coupled to CAM memory cells 100 via BLx 110, BLy 114, BLx* 112 BLy* 116 for each column.

Search data decoder and driver 340 receives a mask register value (mask_reg_value) on line 325, a clock signal (clock) on line 330 and an internal search (int_search) signal on line 335 and provides a search key or word to CAM memory cells 100 via search lines SDx 120 and SDy 122 for each column.

CAM device 300 includes a new component for each row of memory cells 100 and its match line, with the new component shown in FIG. 3 as circuit block A 360. In addition, device 300 includes a new test mode match line reset (TM_ML_reset) signal that resets circuit block A for all match lines in a test mode.

Circuit block A 360 receives signals on match line 130 and word line 132 for the respective row of memory cells (a memory storage location) and also receives the test mode match line reset (TM_ML_reset) signal on line 345. Circuit block A 360 provides a match signal for the row to priority encoder 355 via a circuit block A output line 370. Priority encoder 355 also receives a priority encoder enable (priority_encoder_en) signal 350 and, in response, provides PE output signals.

Figure 4A:
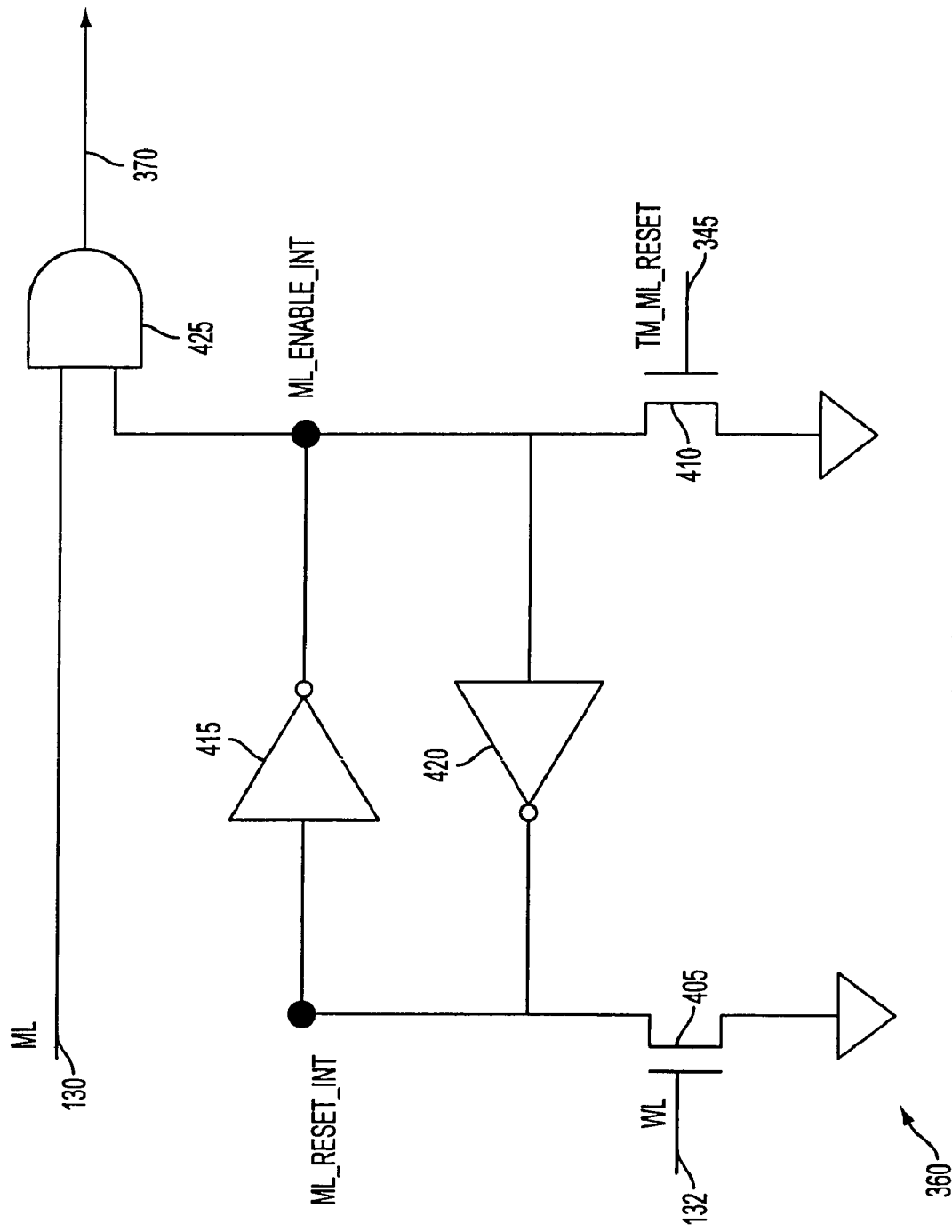
FIG. 4A is a schematic circuit diagram of an exemplary embodiment of circuit block A in FIG. 3.

FIG. 4A is a detailed circuit diagram of an exemplary embodiment of circuit block A 360. The word line WL signal on line 132 is applied to the gate of transistor 405 and the test mode match line reset (TM_ML_reset) signal on line 345 is applied to the gate of transistor 410. Inverters 415, 420 latch the WL input onto AND gate 425 until the TM_ML_reset signal goes high to reset them and turn off AND gate 425. The ML signal on a match line 130 under test is high and is also input to AND gate 425. The output of AND gate 425 is provided on line 370 to priority encoder 355. AND gate 425 is, however, only one example of logic that could respond to the ML signal on match line 130 and to a value latched by inverters 415, 420. For example, if match line 130 were asserted when low, the latched value could be inverted and a different type of gate could be used, such as a NOR gate.

Circuit block A 360 can also provide two other signals, ML_enable_int and ML_reset_int. When word line 132 goes high while TM_ML_reset is low, ML_enable_int goes high. Similarly, when TM_ML_reset goes high while word line 132 is low, ML_reset_int goes high.

Figure 4B:
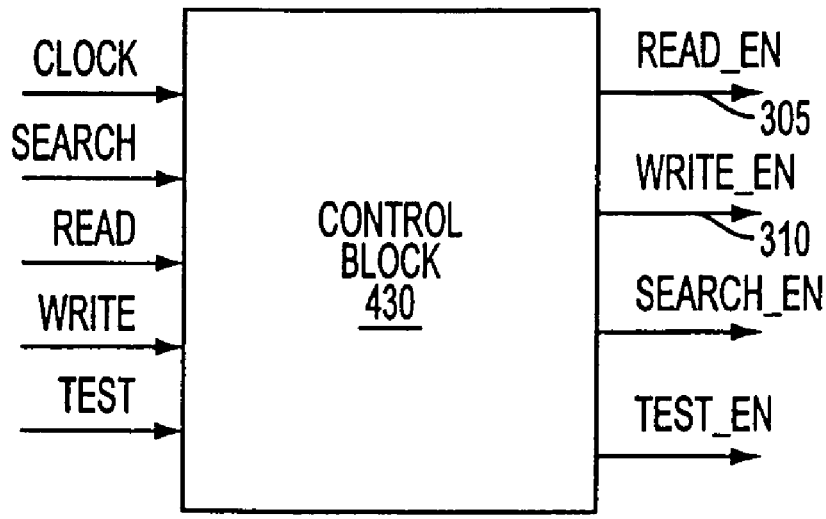
FIG. 4B is a schematic circuit diagram of a control block for the device of FIG. 3.

FIG. 4B is an exemplary embodiment of a control block 430 for CAM device 300. Control block 430 receives a clock signal, a search signal, a read signal, a write signal and a test signal, such as from a host processor or other circuitry (not shown) that controls CAM device 300. Control block 430 outputs a read enable (read_en) signal on line 305 and a write enable (write_en) signal on line 310, which are both input to BL pre-charge circuit 365. Control block 430 also outputs a search enable (search_en) signal, which is input to search control block 445 and a test enable (test_en) signal, which is input to test control block 435.

Figure 4C:
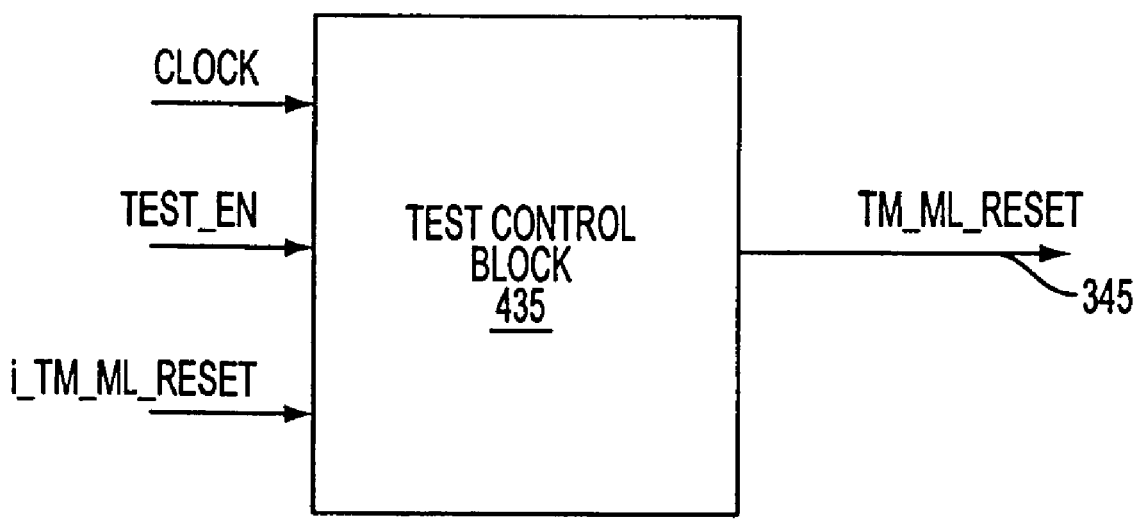
FIG. 4C is a schematic circuit diagram of a test control block for the device of FIG. 3.

FIG. 4C is an exemplary embodiment of a test control block 435 for CAM device 300. Test control block 435 receives a test enable (test_en) signal generated by control block 430, the clock signal and an internal test mode match line reset (i_TM_ML_reset) signal, which can also be received from the host processor (not shown). Test control block 435 outputs TM_ML_reset signal on line 345.

Figure 4D:
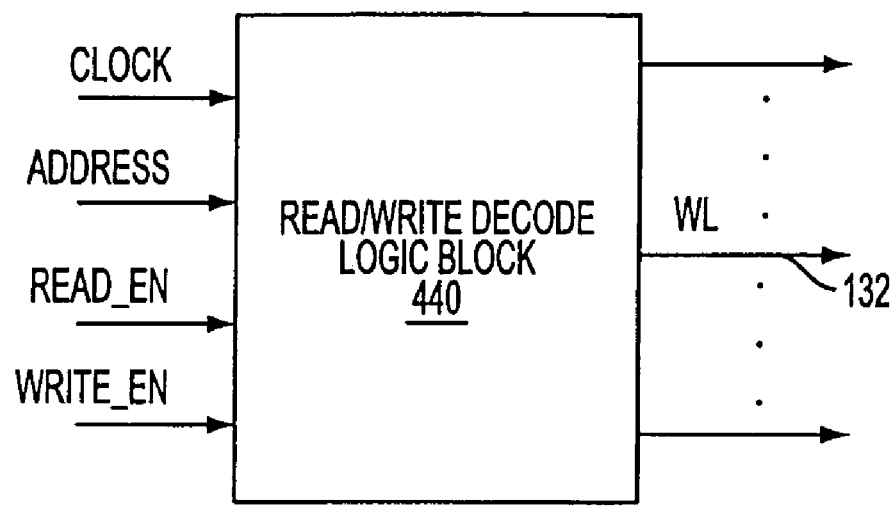
FIG. 4D is a schematic circuit diagram of a read/write decode logic block for the device of FIG. 3.

FIG. 4D is an exemplary embodiment of a read/write decode logic block 440 for CAM device 300. Read/write decode logic block 440 receives the clock signal, the address of a CAM memory storage location, a read enable (read_en) signal generated by control block 430 and a write enable (write_en) signal also generated by control block 430. The address can be received from the host processor (not shown). Read/write decode logic block 440 outputs the VVL signal on word line 132.

Figure 4E:
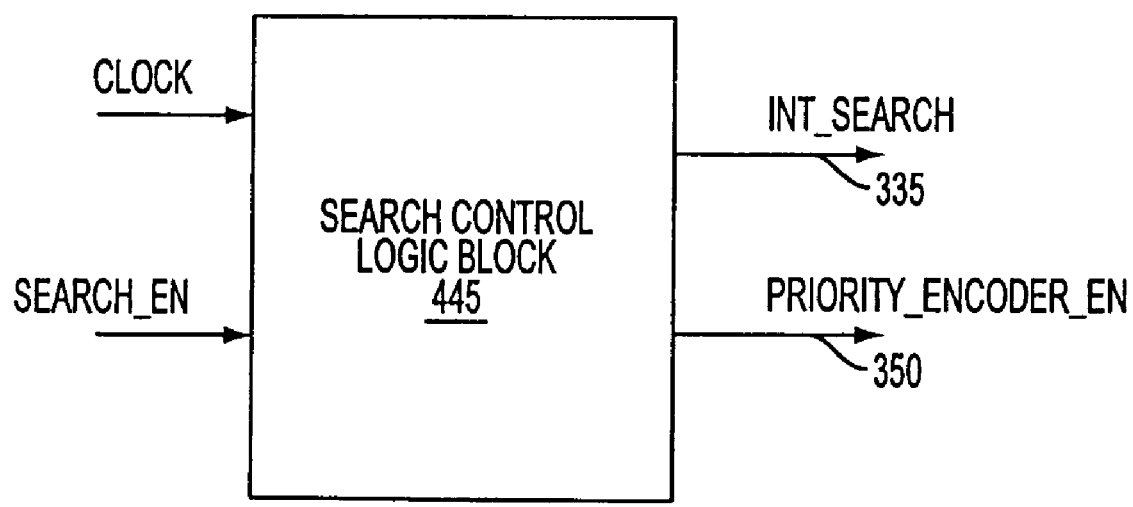
FIG. 4E is a schematic circuit diagram of a search control logic block for the device of FIG. 3.

FIG. 4E is an exemplary embodiment of a search control logic block 445 for CAM device 300. Search control logic block 445 receives the clock signal and a search enable (search_en) signal generated by control block 430. Search control logic block 445 outputs an internal search (int_search) signal on line 335, which is input to search data decoder and driver 340 and a priority encode enable (priority_encoder_en) signal on line 350, which is input to priority encoder 355.

An exemplary embodiment of a search data decoder and driver 340 is shown in FIG. 3. Search data decoder and driver 340 receives an external search data (ext_search_data) signal, one clock signal on line 330, an internal search (int_search) signal generated by search control logic block 445 on line 335 and a mask register value (mask_reg_value) signal on line 325. The ext_search_data signal can be provided by the host processor (not shown). Search data decoder and driver 340 outputs search lines SDx and SDy.

The components in FIGS. 4B-4E illustrate one way in which control signals for CAM device 300 could be obtained. Each component could be implemented with any suitable circuitry that provides the output signals in response to the input signals as described above. The illustrated components are only exemplary and other components could be used.

Figure 5:
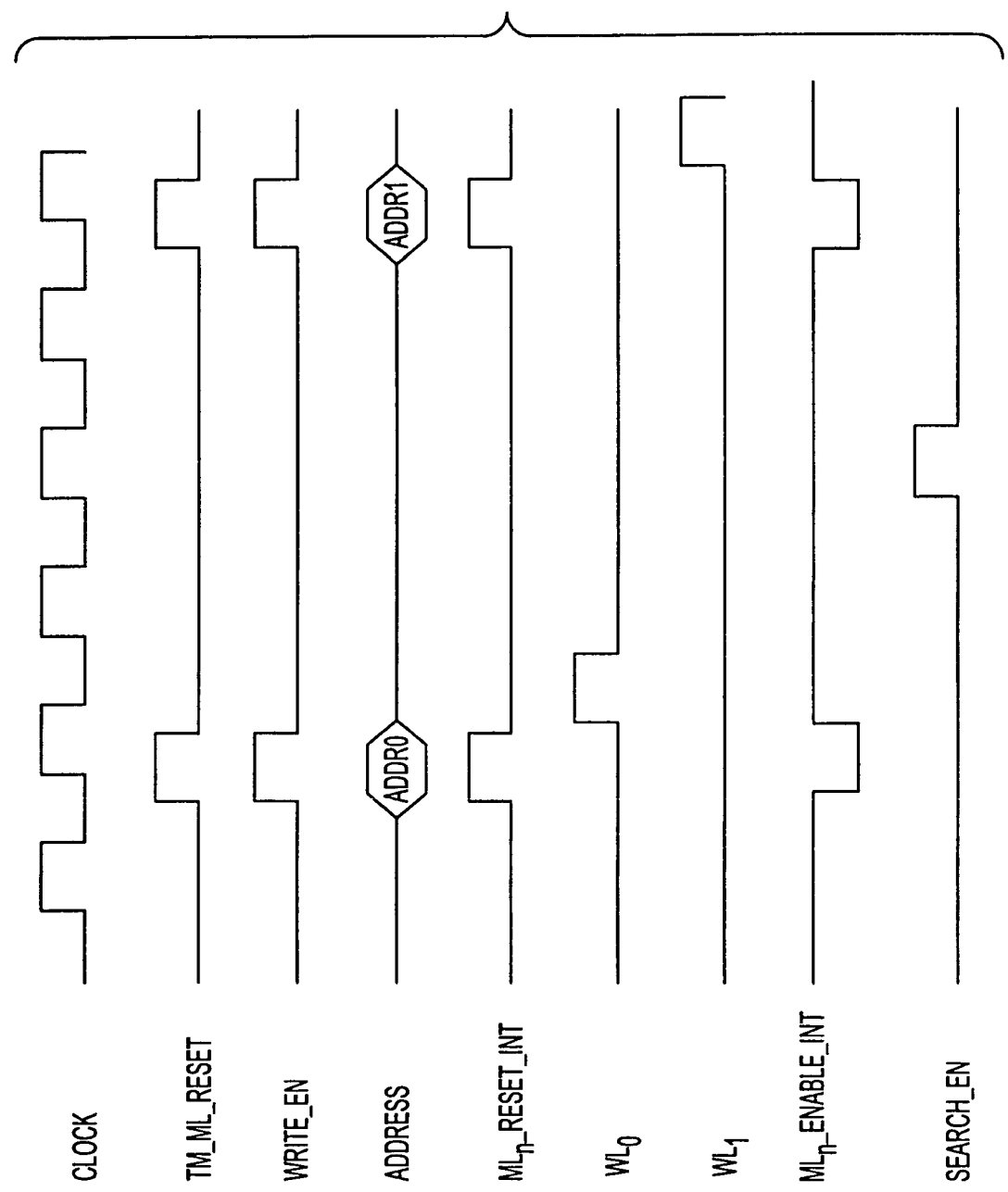
FIG. 5 is a timing diagram illustrating signals provided by the components in FIGS. 3-4E.

FIG. 5 is a timing diagram of several signals in CAM device 300. The clock signal acts as a control signal for the components in FIGS. 4B-4E and other components. After CAM device 300 has been placed in test mode by a test signal to control block 430, control block 430 provides a test_en signal and the match lines of the CAM device are reset/disabled with a TM_ML_reset signal pulse from test control block 435. Control block 430 also provides a write enable (write_en) signal pulse. In response, read/write decode logic block 440 decodes an address, illustratively Addr0, on the next rising edge of the clock signal and also provides a $WL_0$ pulse on the respective word line 132 at the next rising edge of the clock signal. By turning on transistor 405, the $WL_0$ pulse enables AND gate 425, allowing the signal ML on match line 130 to be gated to the priority encoder 355. In addition, an entry is written onto Addr0 during the write_en signal pulse.

FIG. 5 also shows signal ML_reset_int, which goes high with TM_ML_reset signal and goes low when word line 132 goes high on a read or write command. FIG. 5 also shows its inverse, ML_enable_int, which goes high when word line 132 goes high, enabling gate 425. In response to the WL signal (high) applied to the gate of transistor 405, ML_enable_int goes high.

While AND gate 425 is enabled, a search is performed for the selected memory storage location. This can be performed by comparing with search data indicating the entry stored in Addr0, received from a comparand register (not shown)

through search data decoder and driver 340. The search occurs on the rising edge of a pulse of the clock signal when the search enable (search_en) pulse signal is high. If the CAM memory storage location is good (error free) and if its match line 130 is also good (does not have an error/defect), then the match line 130 will provide an asserted match signal. In response, AND gate 425 provides an asserted match signal on line 370. If the respective part of PE 355 is also error and defect free, PE 355 provides an output indicating Addr0. The host processor or other circuitry (not shown) controlling the test can determine the test outcome from the PE output.

The search completes the cycle for testing a single match line 130. The cycle is repeated for each match line 130 of CAM device 300.

Figure 6:
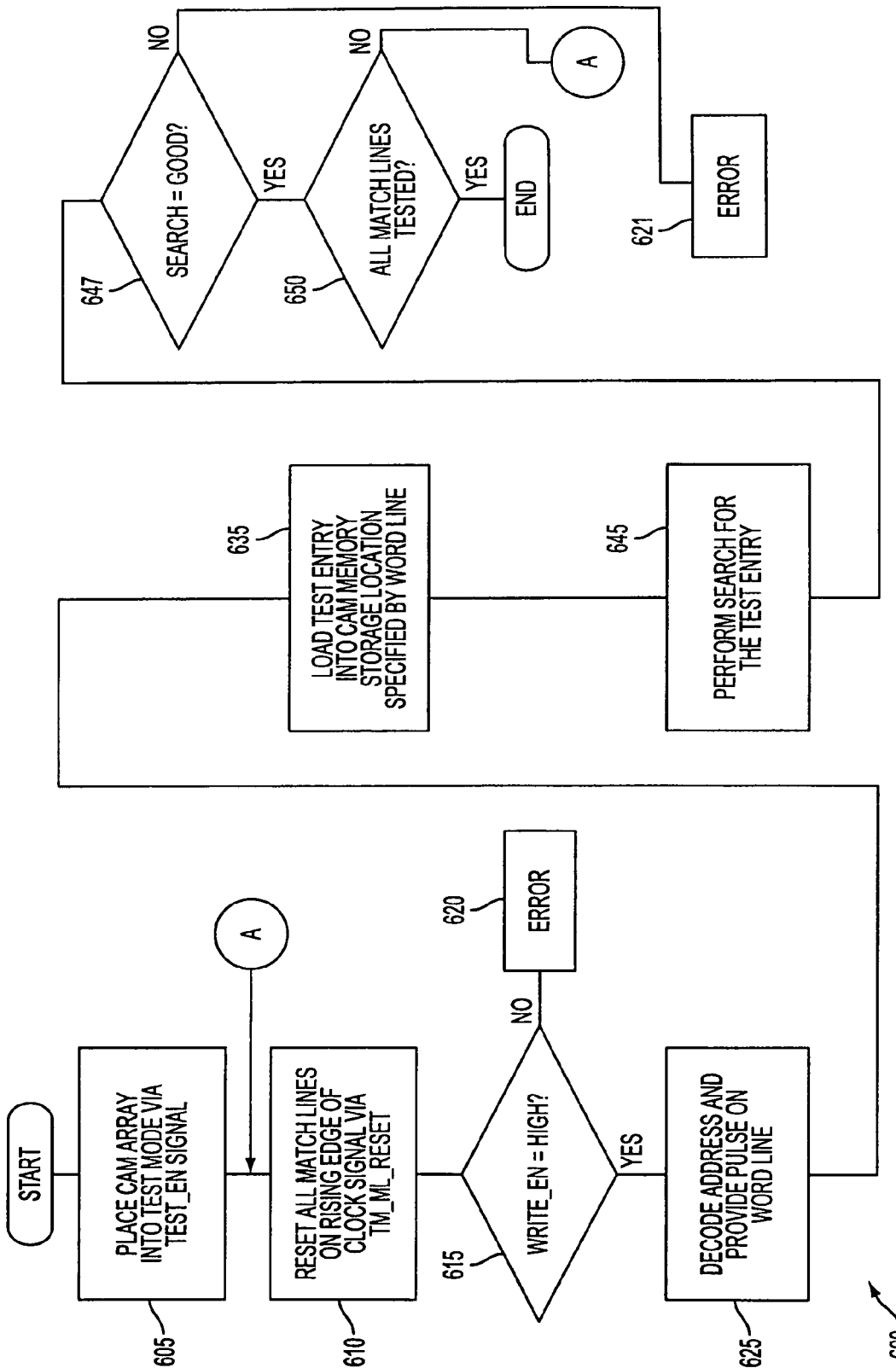
FIG. 6 is a flowchart of the operation of the device of FIG. 3 in accordance with the timing diagram of FIG. 5.

FIG. 6 is a flow diagram corresponding to the timing diagram of FIG. 5. The operations shown in FIG. 6 can be performed under control of a host CPU or other circuitry (not shown) controlling CAM device 300.

The step in box 605 places CAM device 300 in test mode. This can be accomplished by providing a test signal and other appropriate signals to control block 430. In response to a test_en signal, test control block 435 provides a pulse of the TM_ML_reset signal. The pulse causes all match lines to be reset on the rising edge of a pulse of the clock signal in the step in box 610.

At the same time that a test signal is provided to control block 430, an address signal is provided to read/write decode logic block 440 and a test entry to be stored is provided to memory cells 100 through lines 110, 112, 114 and 116. When it provides the test_en signal pulse in the step in box 610, control block 430 also provides a write_en signal pulse to read/write decode logic block 440. Circuitry in block 440 tests the write_en signal in the step in box 615. If write_en is low, then an error/faulty operation is noted in the step in box 620. The step in box 620 also stops testing by providing appropriate signals, such as to control box 430. If write_en is high, however, testing can continue. In response to the address, the write_en signal pulse, and a clock pulse, read/write decode logic block 440 decodes the address and provides a pulse on the CAM word line 132 indicated by the address in the step in box 625. The pulse causes ML_reset_int to go low and ML_enable_int to go high, enabling AND gate 425.

In response to the word line pulse, the test entry is loaded into the selected CAM memory storage location by the step in box 635. In response to the next clock pulse, control block 430 provides a search_en pulse to cause a search for the test entry in the step in box 645. If the match line test is good at step 647 (does not have an error/defect), then the match line 130 under test will be asserted indicating a match. Because ML_enable_int is high for the corresponding word line 132, AND gate 425 is enabled and output match line 370 is asserted, while all other output match lines 370 are not asserted. Therefore, PE 355 should provide PE output indicating the address for the match line under test. The step in box 647 can compare the address from PE output with the address decoded in box 625 to determine whether match line 130 tested good. If the match line 130 is low (mis-match) or if the addresses differ, then faulty operation is indicated at error processing in step in box 621 and testing stops as in the step in box 620.

If all match lines have not yet been tested, control block 430 returns to the step in box 610 to test the next match line 130. If all match lines 130 are operating properly and priority encoder 355 outputs the expected address for each match line 130 of CAM device 300 then priority encoder 355 is also functioning properly.

FIGS. 3-6 are described above with the understanding that the control block of CAM device 300 has logic circuitry within it which controls the testing. It is also possible that the testing may be implemented by means of a host processor accepting external input about which match lines are being tested (which may be a subset of all match lines) and a test order.

FIGS. 3-6 are described above assuming that the priority of lower addresses is higher than the priority of higher addresses in CAM device 300. The priority could be reversed or programmable. Further, for simplicity, CAM device 300 is described above as having a match line for each CAM word line, where a CAM word line corresponds to a CAM memory storage location and is a line running through a CAM memory storage location and into a circuit for detecting match line errors. In other implementations, there is a match line for a group of CAM memory storage locations. Memory cell 100 has been described as a ternary 6T dynamic ternary CAM memory cell. It should be understood that memory cell 100 could be implemented as a static memory cell with a greater or lesser number of transistors.

The circuitry and operations depicted in FIGS. 3-6 may be implemented in hardware, software, firmware, application specific integrated circuits (ASICs) field programmable gate arrays (FPGAs) or any suitable combination thereof Specifically, CAM device 300, including all the circuitry in FIGS. 3-4E may be implemented in a single integrated circuit.

Once a match line error is detected, then corrective action can be taken. Corrective action may include, for example, repair, replacement or marking a corresponding CAM memory storage location as unavailable. After corrective action, testing can be repeated.

Figure 7:
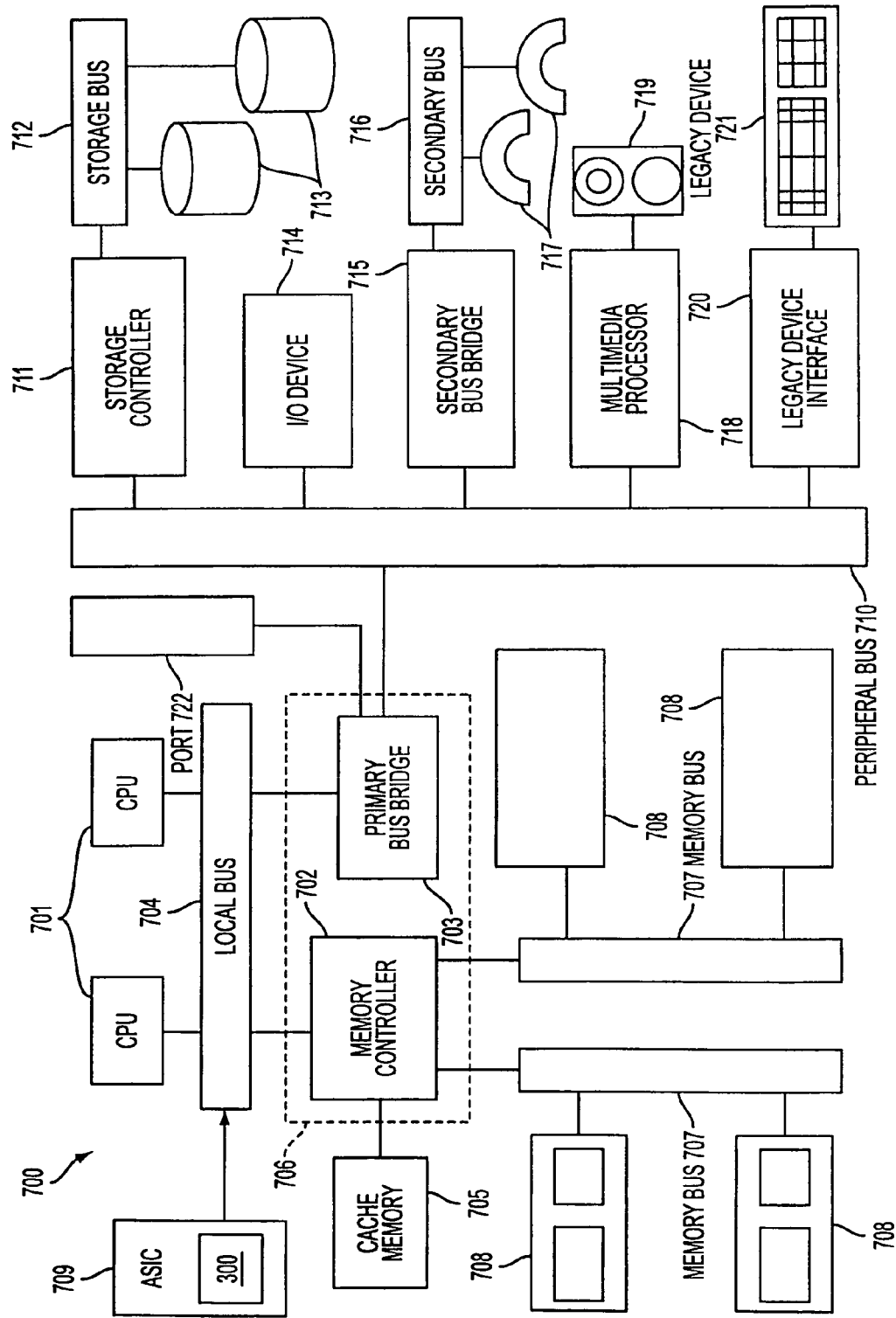
FIG. 7 is a schematic block diagram of an exemplary processing system that includes a CAM device as in FIG. 3.

FIG. 7 illustrates an exemplary processing system 700 that includes CAM device 300 as disclosed above in connection with FIGS. 3-6 on an ASIC. The processing system 700 includes one or more processors 701 coupled to a local bus 704. A memory controller 702 and a primary bus bridge 703 are also coupled to the local bus 704. The processing system 700 may include multiple memory controllers 702 and/or multiple primary bus bridges 703. The memory controller 702 and the primary bus bridge 703 may be integrated as a single device 706. ASIC 709 is also illustratively connected to local bus 704, and includes CAM device 300 as in FIG. 3, embedded with other circuitry suitable to the application. ASIC 709 could, for example, be an additional CPU.

Memory controller 702 is also coupled to one or more memory buses 707. Each memory bus 707 accepts memory components 708 which include at least one CAM device having a match line testing circuit of the present invention. The memory components 708 may be a memory card or a memory module. Examples of memory modules include single inline memory modules (SIMMs) and dual inline memory modules (DIMMs). The memory components 708 may include one or more additional devices (not shown). For example, in a SIMM or DIMM, the additional device might be a configuration memory, such as a serial presence detect (SPD) memory. The memory controller 702 may also be coupled to a cache memory 705. The cache memory 705 may be the only cache memory in the processing system. Alternatively, other devices, for example, processors 701 may also include cache memories, which may form a cache hierarchy with cache memory 705. If the processing system 700 includes peripherals or controllers which are bus masters or which support direct memory access (DMA), the memory controller 702 may implement a cache coherency protocol. If the memory controller 702 is coupled to a plurality of memory buses 707, each memory bus 707 may be operated in parallel, or different address ranges may be mapped to different memory buses 707.

The primary bus bridge 703 is coupled to at least one peripheral bus 710. Various devices, such as peripherals or additional bus bridges may be coupled to the peripheral bus 710. These devices may include a storage controller 711, a miscellaneous I/O device 714, a secondary bus bridge 715, a multimedia processor 718, and a legacy device interface 720. The primary bus bridge 703 may also be coupled to one or more special purpose high speed ports (not shown). In a personal computer, for example, the special purpose port might be the Accelerated Graphics Port (AGP), used to couple a high performance video card to the processing system 700.

The storage controller 711 couples one or more storage devices 713, via a storage bus 712, to the peripheral bus 710. For example, the storage controller 711 may be a SCSI controller and storage devices 713 may be SCSI discs. The I/O device 714 may be any sort of peripheral. For example, the I/O device 714 may be a local area network interface, such as an Ethernet card. The secondary bus bridge may be used to interface additional devices via another bus to the processing system. For example, the secondary bus 716 may be a universal serial port (USB) controller used to couple USB bus devices 717 via to the processing system 700. The multimedia processor 718 may be a sound card, a video capture card, or any other type of media interface, which may also be coupled to one additional devices such as speakers 719. The legacy device interface 720 is used to couple legacy devices 721, for example, older styled keyboards and mice, to the processing system 700.

The processing system 700 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 700 to become more suitable for use in a variety of applications. For example, many electronic devices, which require processing may be implemented using a simpler architecture, which relies on a CPU 701 coupled to memory components 708 and/or memory buffer devices 704. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Figure 8:
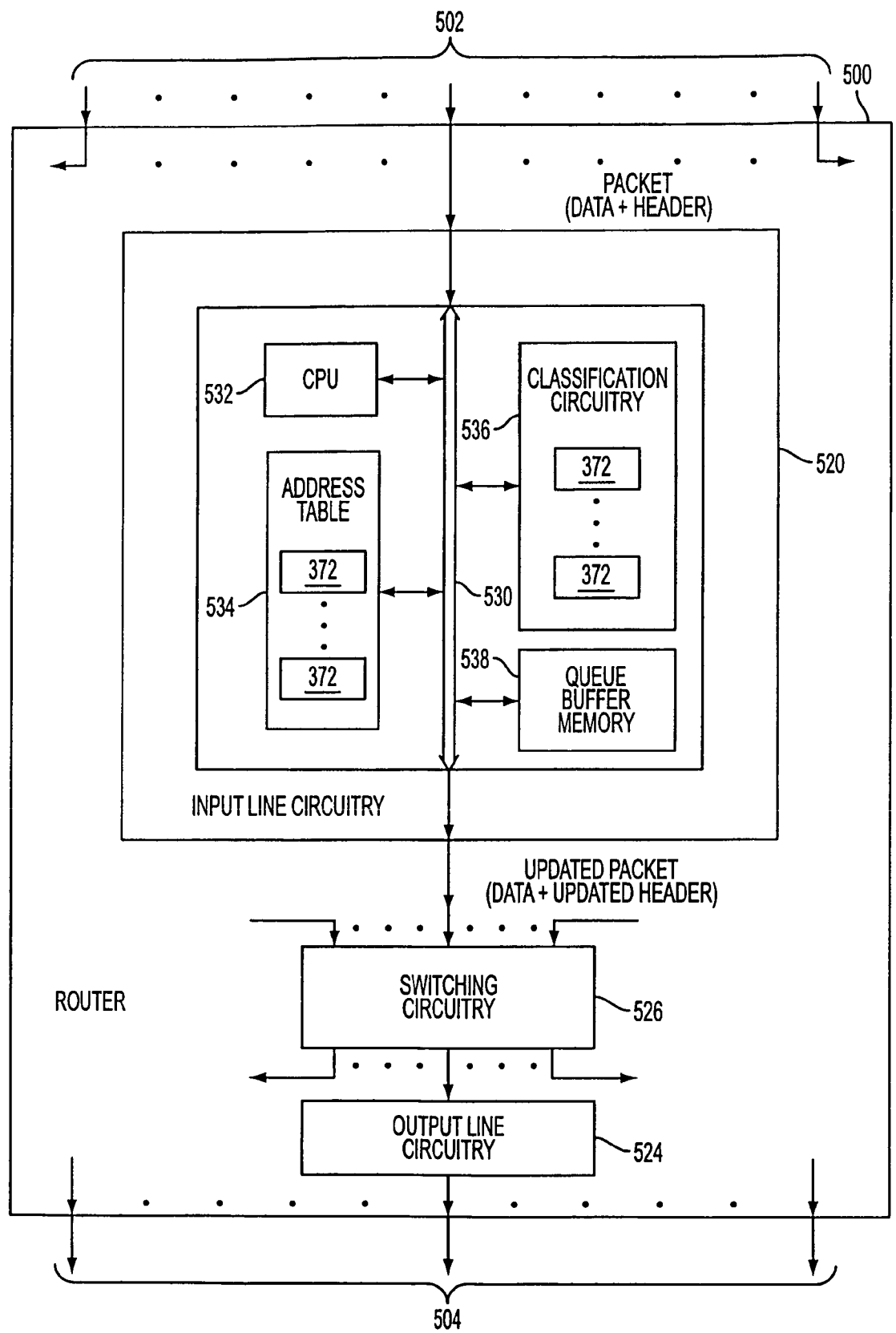
FIG. 8 is a schematic circuit diagram of a router that includes a CAM device as in FIG. 3.

A more common application of CAM circuitry is in routers. FIG. 8 shows a simplified block diagram of a router 500 as may be used in a communications network such as the Internet backbone. Router 500 has input lines 502 and output lines 504. In applications where data is transmitted from node/location to node/location in packets, router 500 can receive a packet on input lines 502, decode a part of the packet identifing its final destination, provide forwarding instructions for the packet, and transmit the packet on output lines 504.

Router 500 includes circuitry for each input line, as illustrated by input line circuitry 520 for one of input lines 502. Router 500 similarly includes circuitry for each output line, as illustrated by output line circuitry 524 for one of output lines 504. Input line circuitry 520 and output line circuitry 524 can each be implemented as line cards, and a respective line card can sit on each ingress or egress port. Ingress port line cards can receive input packets from input lines 502, process them, and send the resulting processed packets via switching circuitry 526 to egress port line cards. Egress port line cards can further process the packets before sending them out on output lines 504. Therefore, ingress and egress port line cards can be implemented with similar or identical circuitry, so that the same line card could be used either as input line circuitry 520 or output line circuitry 524.

Exemplary components of input line circuitry 520 are shown, although circuitry 520 could be implemented in many different ways. Bus circuitry 530 provides communication between CPU 532 and other components, which include address table 534, classification circuitry 536, and queue buffer memory 538. Address table 534 and classification circuitry 536 each illustratively include a set of one or more CAM devices 300 as in FIG. 3. CAM devices 300 can be used to efficiently retrieve information used by CPU 532 in processing and retransmitting packets.

In operation, CPU 532 can provide a packet's internet protocol (IP) address to address table 534, where the IP address can be provided to CAM devices 300 as a search key for retrieval of an IP address for the next hop. Then CPU 532 uses the next hop's IP address to update the packet's header. CPU 532 can also provide all or part of the packet to classification circuitry 536, which can respond with information for services such as prioritization, security, accounting, traffic shaping, and so forth. Classification circuitry 536 can provide parts of the packet to CAM devices 300 as search keys for retrieval of relevant information. Upon updating the packet's header (and possibly also its data) to include the next hop IP address and possibly information from classification circuitry 536, CPU 532 can provide the packet to queue buffer memory 538, where it is stored until it can be retransmitted, such as through switching circuitry 526.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A content addressable memory device, comprising:
   two or more sets of content addressable memory cells, each set of memory cells being associated with and connected to a match line that provides a match signal when items of data stored in the set of memory cells match a data item stored in a comparand register of the device;
   a first circuit, the first circuit for connecting the match line of a set of memory cells being tested to a priority encoder and for disconnecting match lines of other sets of memory cells from the priority encoder;
   a second circuit, the second circuit for storing items of data matching the data item stored in the comparand register in the set of memory cells being tested; and
   a third circuit, the third circuit for receiving output signals from the connected match line and determining whether the output signals indicate that the set of memory cells being tested has items of stored data that match the data item stored in a comparand register;
   wherein the test on the memory cells comprises comparing results of a search of the memory cells with expected results.

2. The memory device of claim 1, wherein each set of memory cells comprises a memory storage location associated with an address and the third circuit determines whether the output signals indicate addresses of the set of memory cells being tested.

3. The memory device of claim 2, further comprising the priority encoder and being coupled to the third circuit, the priority encoder adapted to output the address of the memory storage location corresponding to the set of memory cells being tested if there is no error.

4. The memory device of claim 2, wherein the sets of content addressable memory cells are respectively associated with a word line that selects the associated set of memory cells, the first circuit connects the match line of the set of memory cells being tested in response to a signal on the associated word line.

5. A content addressable memory device, comprising:
   means for placing the memory device in a test mode;
   means for disconnecting all match lines of the memory device from a priority encoder of the memory device;
   means for connecting output from a match line under test to the priority encoder;
   means for decoding an address of a selected memory storage location corresponding to the match line under test;
   means for loading the selected memory storage location and a comparand register with a known data pattern;
   means for performing a search operation, for the known data pattern in the comparand register, on the memory device;
   means for outputting a result of the search operation;
   means for comparing the result of the search operation with an expected result, the expected result comprising an expected match indication on the match line under test; and
   means for confirming proper operation of the memory device if the result of the search operation is equal to the expected result.

6. The memory device of claim 5 further comprising means for indicating an error of the memory device if the result of the search operation is not equal to the expected result.

7. The memory device of claim 5 further comprising:
   means for disconnecting output from the match line under test from the priority encoder; and
   means for enabling output from the memory storage location under test.

8. The memory device of claim 5, wherein there is a one-to-one correspondence between the match lines and the memory storage locations.

9. The memory device of claim 5, wherein there is a one-to-many correspondence between each match line and the memory storage locations.

10. A method of operating a content addressable memory device, the method comprising:
    placing the memory device in a test mode;
    disconnecting all match lines of the memory device from a priority encoder of the memory device on the rising edge of a clock signal;
    connecting a match line under test to the priority encoder;
    decoding an address of a selected memory storage location corresponding to the match line under test on the rising edge of the clock signal;
    loading the selected memory storage location and a comparand register with a known data pattern on the rising edge of the clock signal;
    performing a search operation for the known data pattern;
    comparing a result of the search operation with an expected result of the search operation, whereby the expected result comprises an expected match line indication for the match line under test; and
    if the result of the search operation does not match the expected result, the method further comprises indicating an error of the memory device, and if the result of the search operation matches the expected result, the method further comprises confirming proper operation of the memory device.

11. The method according to claim 10, wherein there is a one-to-one correspondence between the match lines and the memory storage locations.

12. The method according to claim 10, wherein there is a one-to-many correspondence between each the match line and the memory storage locations.

* * * * *